(12) United States Patent
Fonash et al.

(10) Patent No.: US 6,171,740 B1
(45) Date of Patent: Jan. 9, 2001

(54) ELECTROSTATIC PRINTING OF A METALLIC TONER TO PRODUCE A POLYCRYSTALLINE SEMICONDUCTOR FROM AN AMORPHOUS SEMICONDUCTOR

(75) Inventors: Stephen J. Fonash; Ali Kaan Kalkan, both of State College, PA (US); Robert H. Detig, Berkeley Heights, NJ (US)

(73) Assignee: The Penn State Research Foundation, University Park, PA (US)

( * ) Notice: Under 35 U.S.C. 154(b), the term of this patent shall be extended for 0 days.

(21) Appl. No.: 09/340,009

(22) Filed: Jun. 25, 1999

Related U.S. Application Data

(60) Provisional application No. 60/090,663, filed on Jun. 25, 1998.

(51) Int. Cl.[7] .................................................... G03G 13/16
(52) U.S. Cl. ............................ 430/52; 430/126; 438/486
(53) Field of Search .................................. 430/16, 47, 52, 430/67, 126; 438/97, 486

(56) References Cited

U.S. PATENT DOCUMENTS

| | | | |
|---|---|---|---|
| 3,900,412 | 8/1975 | Kosel | ................................. 252/62.1 |
| 5,102,756 | * 4/1992 | Vincett et al. | ........................ 430/67 |
| 5,147,826 | 9/1992 | Liu et al. | .............................. 437/233 |
| 5,275,851 | 1/1994 | Fonash et al. | ....................... 437/101 |
| 5,543,352 | 8/1996 | Ohtani et al. | ........................ 437/101 |
| 5,585,291 | 12/1996 | Ohtani et al. | .......................... 437/40 |
| 5,612,250 | 3/1997 | Ohtani et al. | ....................... 437/101 |
| 5,643,826 | 7/1997 | Ohtani et al. | .......................... 437/88 |
| 5,654,203 | 8/1997 | Ohtani et al. | .......................... 438/97 |
| 5,843,225 | * 12/1998 | Takayama et al. | ...................... 117/8 |
| 5,923,968 | * 7/1999 | Yamazaki et al. | ....................... 117/8 |

* cited by examiner

*Primary Examiner*—John Goodrow
(74) *Attorney, Agent, or Firm*—Thomas J. Monahan

(57) ABSTRACT

A catalytic liquid toner is electrostatically printed on an amorphous silicon layer (or a substrate that is to support such a layer), in an image-wise fashion. After the liquid toner is dried, the amorphous silicon layer is heated, preferably using rapid thermal annealing, to approximately 550° C. for about 2 minutes to cause the toned areas to be converted to polysilicon. The toner used during the printing action is a dispersion of resin particles which contain a metallic catalyst, such as palladium, nickel or chromium.

16 Claims, 2 Drawing Sheets

ELECTROSTATIC PRINTING OF A METALLIC TONER TO PRODUCE A POLYCRYSTALLINE SEMICONDUCTOR FROM AN AMORPHOUS SEMICONDUCTOR

This Application claims priority from U.S. Provisional Patent Application Serial No. 60/090,663, filed Jun. 25, 1998 pending.

FIELD OF THE INVENTION

This invention relates to a method and apparatus for crystallizing amorphous films into polycrystalline films and, more particularly, to an electrostatic printing method and apparatus for selective deposition of catalyst metals to achieving such selective crystallization.

BACKGROUND OF THE INVENTION

Large area amorphous silicon layers are widely used to make the transistors used for flat panel display devices. Indeed the most widely used flat panel display, i.e., the active matrix liquid crystal display (AMLCD), derives its name from an active matrix of transistors that are arranged in both the X and Y directions. A transistor made from amorphous silicon is placed at each picture element (pixel) in each color for a color display (red, green, and blue).

Transistors made from amorphous silicon exhibit low performance characteristics (compared to those made from single crystal silicon), with low carrier mobility being a determining property. Researchers have recognized that converting amorphous silicon to poly crystalline silicon (poly Si) will enhance performance considerably, even to a significant fraction of the performance of single crystal silicon, the material from which all integrated circuits are made.

Studies of poly-Si thin film transistors have concentrated on methods for reducing their fabrication costs, either by reducing the transistors' processing time or by lowering the processing temperatures. The latter effect is important since it allows the usage of less expensive substrates for the transistor arrays, e.g., glass, plastic, etc . . . For instance, Czubatyj et al. in "Low-Temperature Polycrystalline TFT on 7057 Glass", IEEE Electron Device Letters, Vol. 10, pages 349–351, 1989, demonstrates that polysilicon thin film transistors can be fabricated on 7059 glass substrates using relatively low temperature furnace annealing for crystallization. However, the crystallization process takes longer than 75 hours and is therefore not practically applicable.

Poly-Si films can be deposited, deposited and recrystallized, or deposited in the amorphous ($\alpha$-Si) form and then crystallized into poly-Si films. There are three principal crystallization processes: furnace annealing, rapid thermal process (RTP) and laser annealing. The first two are solid phase crystallization techniques, while the third is a liquid phase technique. Although reported laser annealing techniques have the potential for effecting low temperature crystallization, laser crystallization suffers from the need to raster the laser beam; raising throughput issues. Laser annealing also exhibits other difficulties, e.g. reproducibility, uniformity and peel-off. The most commonly used methods for producing large grain poly-Si films are furnace annealing of $\alpha$-Si films at temperatures >=600° C., with very long processing times (16–30 hours or longer for $\alpha$-Si films) or the RTP approach (e.g. 700° C./5 mins)

An inventor hereof in "Low Thermal Budget PolySilicon Thin Film Transistors on Glass", Japanese Journal of Applied Physics, Vol. 30, pages L269–L271, 1991 has demonstrated that thin film transistors can be fabricated on poly-Si films made by the crystallization of precursor $\alpha$-Si films. Those polycrystalline films were obtained by a rapid thermal annealing of the precursor films for five minutes at 700° C. on 7059 glass substrates.

In U.S. Pat. No. 5,147,826 to Liu et al., it is shown that a prior art thermal anneal procedure at 700° C. (for converting $\alpha$-Si to poly-Si) can be reduced to a range of from 550° C. to 650° C. This improvement is accomplished by depositing a thin discontinuous film of a nucleating site forming material over an already deposited layer of $\alpha$-Si. The $\alpha$-Si film is then rapidly thermally annealed, with the nucleating site forming material enabling crystallization of the underlying $\alpha$-Si at temperatures lower than theretofore reported.

Liu et al. also report in the '826 patent that $\alpha$-Si can be selectively crystallized by depositing the nucleating site performing material in a pattern thereon and subsequently subjecting the patternized surface to an anneal procedure. Because the nucleating site forming material is a metal, the treated surface of the subsequently crystallized silicon is not optimal for structures. As a result, additional processing steps are required to allow untreated surfaces to become boundaries for devices to be grown.

In U.S. Pat. No. 5,275,826 of Fonash et al., a fabrication process for polycrystalline silicon thin film transistors is described that commences with a deposition of an ultra-thin nucleating-site forming layer onto the surface of an insulating substrate (e.g., 7059 glass, plastic). Next, an $\alpha$-Si film is deposited thereover and the combined films are annealed at temperatures that do not exceed 600° C. By patterning the deposition of the nucleating site forming material on the glass substrate, the subsequently deposited $\alpha$-Si film can be selectively crystallized only in areas in contact with the nucleating-site forming material.

Ohtani et al. in U.S. Pat. Nos. 5,585,291, 5,612,250, 5,643,826, 5,543,352, and 5,654,203 describe a solution method for applying a catalyst metal to enhance subsequent $\alpha$-Si crystallization.

The aforesaid prior art thus clearly indicates that catalysts can be used to reduce the time-temperature thermal budget needed for crystallization of semiconductor materials. For example, catalytic agents like palladium or nickel can be deposited by various techniques like vacuum evaporation or from solution and such catalytic agents can substantially impact the thermal budget. The crystallization time may be shortened to as low as 4 minutes at 550° C. by such metal treatments.

Each of the above-cited references has employed some form of photolithographic masking to achieve selective deposition of the catalytic metal on selected parts of a substrate. Such procedures require a number of steps and add to the cost of the ultimate product made thereby.

Accordingly, it is an object of this invention to provide an improved method and apparatus for applying a crystallization catalyst onto an amorphous semiconductor film.

SUMMARY OF THE INVENTION

This invention utilizes electrophotography to apply a crystallization catalyst to an amorphous semiconductor layer. The catalyst is subsequently employed to convert areas of the amorphous semiconductor layer to discrete, defined polycrystalline regions.

A catalytic liquid toner is electrostatically printed on an amorphous silicon layer (or a substrate that is to support such a layer), in an image-wise fashion. After the liquid toner is dried, the amorphous silicon layer is heated, preferably using rapid thermal annealing, to approximately 550° C. for about 2 minutes to complete the poly conversion process. The toner used during the printing action is a dispersion of resin particles which contain a modest amount of metallic catalyst, such as palladium, nickel or chromium.

The printing step initially forms latent images on a photo-sensitive receptor plate or drum The latent images are developed by application of a liquid toner.

The toner particles are then transferred to the amorphous Si ($\alpha$-Si) layers. After the toner is dried, the patterning process is complete. The Si layer is now heat processed to complete the polycrystalline process.

For many applications, the remaining unprinted $\alpha$-Si regions are unconverted to poly Si and need not be removed, a significant process saving step unless required by demands such as stress control or light transmission.

The process of the invention is simple, low cost and is much like a copy machine and enables the printing of a catalyst-containing liquid toner, preferably on an amorphous silicon layer that resides on a glass layer. Plastics and metal foils covered by an insulating layer can also be used. The patterning and image registration can be performed to high accuracy using the process of the invention. The process sequence may be modified by applying the catalyst-containing toner to the substrate prior to deposition and annealing of the $\alpha$-semiconductor. The $\alpha$-semiconductor can be a material other than $\alpha$-Si, e.g., amorphous carbon, germanium and alloys thereof.

DETAILED DESCRIPTION OF THE PREFERRED EMBODIMENT

Figure 1:
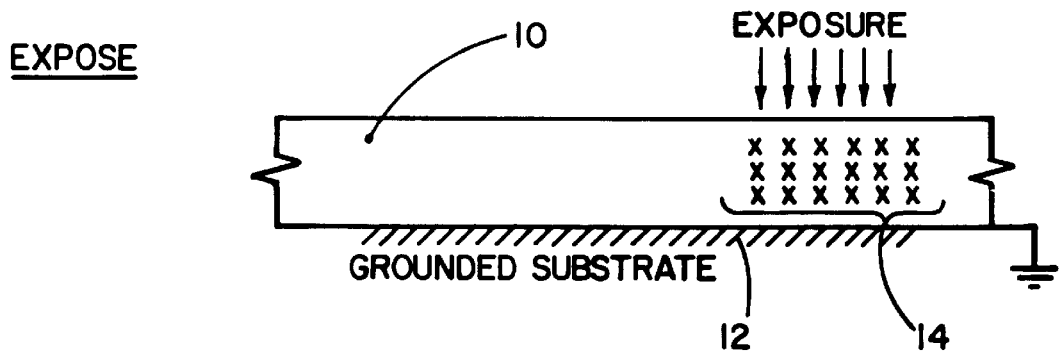
FIG. 1 illustrates a first step in the process of the invention wherein a photosensitive plate material is selectively cross-linked by application of actinic energy

FIG. 1 shows the first step in the electrostatic printing process of the invention, i.e., the making of the printing plate. A photopolymer material 10, preferably in a dry film form, is laminated to a grounded substrate 12. Photopolymer 10 exhibits the characteristics of photoresists that are used for photolithography applications (e.g., etch resistance). A preferred photopolymer is Dynachem 5038, available from the Dynachem Corporation, Tustin Calif. Another photopolymer that is acceptable is Riston 4615, a product of the Dupont Corporation, Wilmington, Del.

Photopolymer 10 should have the characteristic of crosslinking in areas exposed to actinic energy. As shown in FIG. 1, photopolymer 10 is exposed through a photo tool to actinic radiation in the 300 to 400 nm range or the near ultra violet region of the spectrum. Exposure levels are typically from 50 to 500 millijoules per $cm^2$. Such exposure causes areas 14 to crosslink and at this stage, the plate making step is complete. To achieve selective image-wise charging, a modulated laser beam may be swept across the surface of photosensitive material 10 in the manner of a laser printer. A similar result can be achieved through use of a line of modulated laser diodes that are moved over the surface of photosensitive material 10. Further, it is to be understood that while the foregoing description will consider use of a flat plate photopolymer, that the invention can be carried out using a flexible photopolymer that is imaged by either a swept modulated laser beam or a line of modulated laser diodes.

Figure 2:
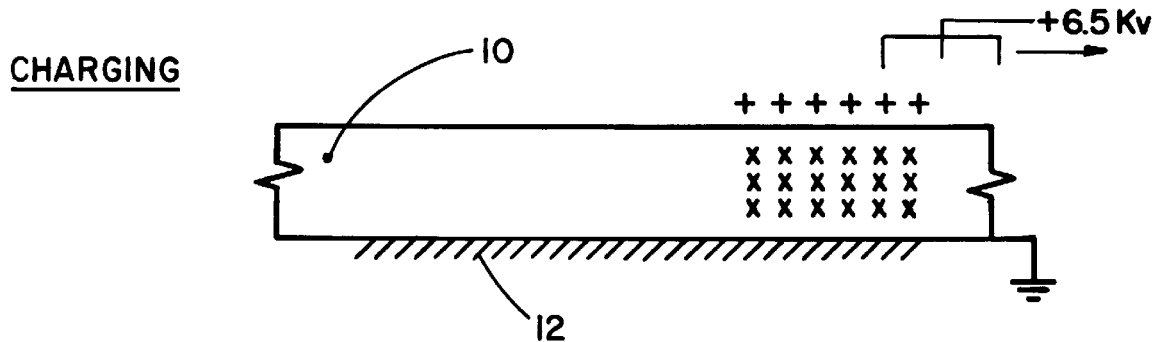
FIG. 2 illustrates a second step in the process of the invention wherein a photosensitive plate material is electrostatically charged.

Photosensitive material 10 is now sensitized by charging it, for example with a corona unit, as shown in FIG. 2. A positive charge is shown as being applied but the photosensitive material 10 can accept either positive or negative charge.

Where photosensitive material 10 is exposed, the resulting crosslinking raises the electrical resistivity of the material by 4 to 6 orders of magnitude. This enables photosensitive material 10 to retain its charge in the crosslinked areas after the charging step, while unexposed regions quickly discharge.

Figure 3:
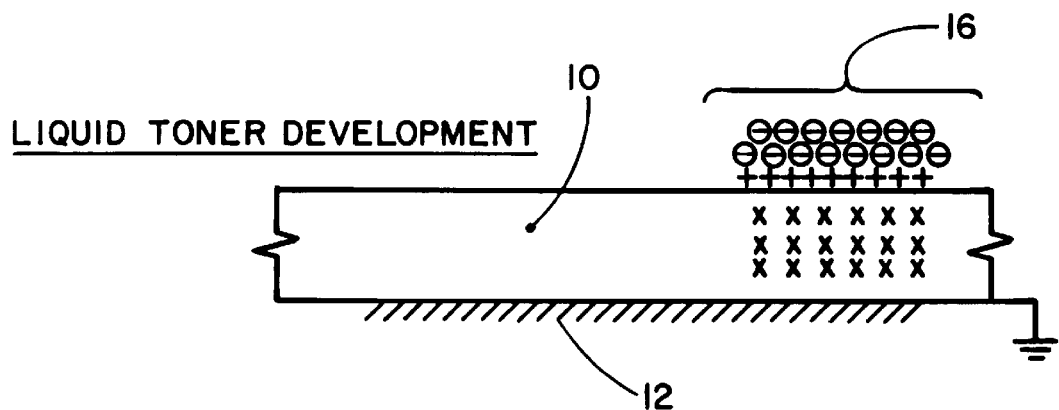
FIG. 3 illustrates a third step in the process of the invention wherein catalyst-containing toner is applied to the charged photosensitive plate material.

In FIG. 3, the previously charged areas of photosensitive material 10 are "toned" with liquid toner particles as indicated by the negatively charged spheres 16. Each sphere 16 comprises a metal catalyst particle encompassed by a polymeric shell. Details of the method of manufacture of toner particles 16 are given below.

Figure 4:
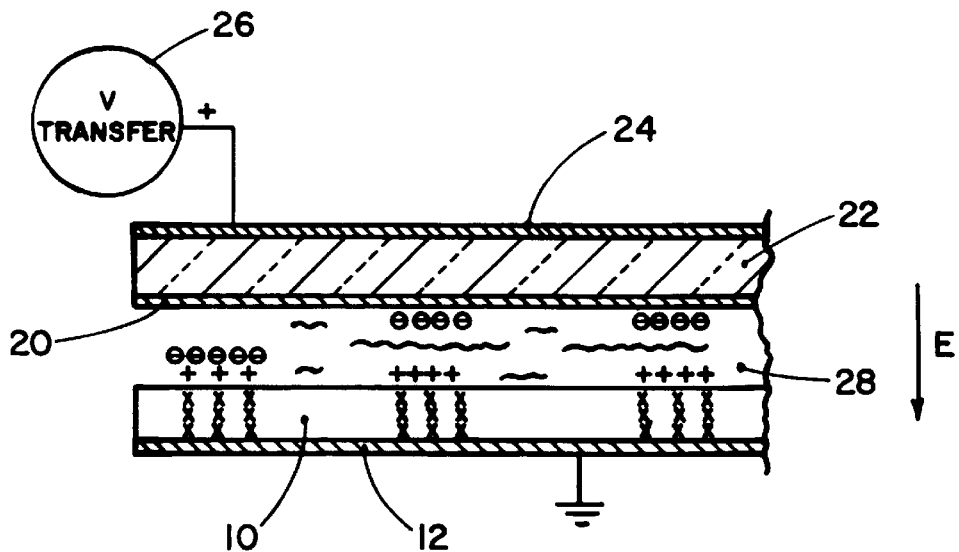
FIG. 4 illustrates a fourth step in the process of the invention wherein the catalyst-containing toner is transferred from the charged photosensitive plate material to an amorphous semiconductor layer by action of an applied electric field.

Next, as shown in FIG. 4, the plate including photosensitive material 10 is placed close to an amorphous silicon layer 20 supported by a glass plate 22. A conductive layer 24 is disposed on the opposite face of glass plate 22 and is connected to a voltage supply 26. The region between photosensitive material 10 and amorphous silicon layer 20 is filled with a nonconductive fluid, e.g., Isopar G, a product of the Exxon Corporation. The mechanical gap between amorphous silicon layer 20 and photoconductor 10 is preferably of the order of 50 to 150 microns. Thereafter, toner particles 16 are transferred across the fluid filled mechanical gap to amorphous silicon layer 20 by means of an electric field that is created when a transfer voltage is applied to conductor 24 by voltage supply 26. The transfer voltage is typically in the range of 500 to 2000 volts, with a polarity opposite to that of the toner particles. Accordingly, the toner particles are attracted to amorphous silicon layer 20 by the electric field and remain restricted to areas in alignment with those on photoconductor 10.

The toner "imaged" amorphous silicon layer 20 is now removed and dried before being furnace treated or subjected to a rapid thermal anneal process to produce Poly Si where the toner was imaged. The selective crystallization of amorphous silicon layer 10 occurs as described by Liu et al. in U.S. Pat. No. 5,147,826 or Fonash et al. in U.S. Pat. No. 5,275,851, both described above.

Figure 5A:
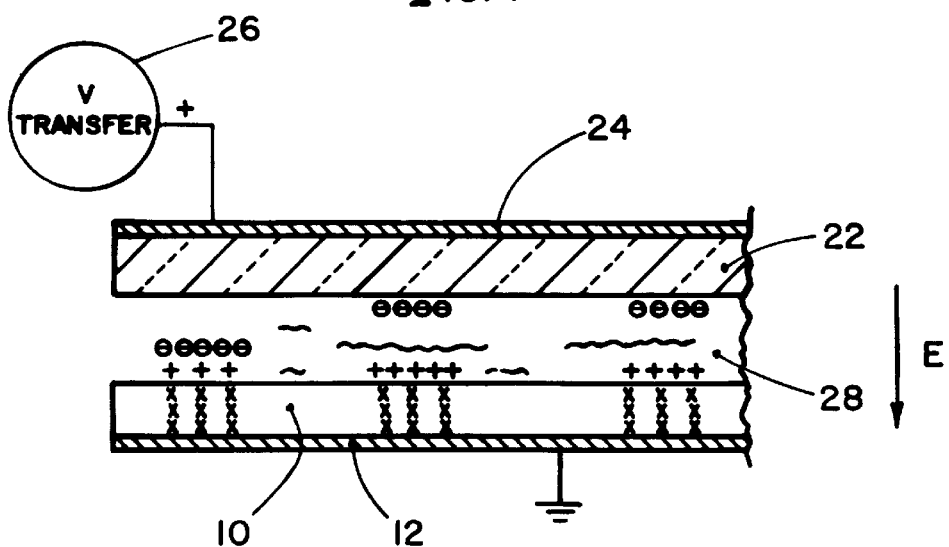
FIGS. 5a, 5b illustrate an alternate fourth step in the process of the invention wherein the catalyst-containing toner is transferred from the charged photosensitive plate material to a substrate, followed by deposition thereon of an amorphous semiconductor, and then followed by an anneal operation to achieve selective crystallization of the amorphous semiconductor layer portions that are in contact with the toner.
Figure 5B:
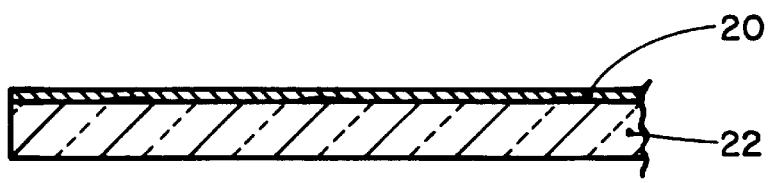

FIG. 5a illustrates an alternate fourth step in the process of the invention wherein the catalyst-containing toner is transferred from charged photosensitive plate material 10 to substrate 22, followed by deposition thereon of amorphous semiconductor layer 20 (FIG. 5b). Then an anneal operation is performed to achieve selective crystallization of the amorphous semiconductor layer portions that are in contact with the toner.

EXAMPLE

Samples of amorphous silicon layers were prepared by RF-PECVD from hydrogen diluted silane at 250° C. on Corning 7059 glass. These amorphous Si layers were then imaged in the following manner:

1.) An electrostatic printing plate ESP-4 from the Electrox Corporation; Newark, N.J. was charged to approximately –1000v by means of a corona charge.
2.) The plate was developed with palladium toner (Electrox EPT1-b) by ordinary means.
3.) Using 125 micron thick polyester film spacer strips, the Si coated glass was spaced away from the ESP-4 plate by a mechanical gap of 125 micron filled with Isopar G (Exxon).
4.) With a voltage of –1500v applied to the amorphous silicon, the palladium toner particles transferred across the gap in an orderly, image wise fashion to the amorphous silicon.
5.) The toned silicon coated Corning 7059 glass was lifted off the ESP-4 plate and spacers and the excess Isopar G liquid was dried.
6.) The amorphous Si layer was subjected to a rapid thermal anneal (RTA) process at 550–600° C. for 5 to 10 minutes at Penn State University. Poly silicon features were demonstrated in the areas covered with the palladium toner.

METAL CATALYST-CONTAINING TONER COMPOSITION

An organosol toner was selected for use with the invention. A preferred organosol is similar to organosol compositions reported in U.S. Pat. No. 3,900,412 (G. Kosel). This patent discloses a class of liquid toners that make use of self-stable organosols as polymeric binders to promote self-fixing of a developed latent image. Self-stable organosols are colloidal (0.1–1 micron diameter) particles of polymeric binder which are typically synthesized by nonaqueous dispersion polymerization in a low dielectric hydrocarbon solvent. The organosol particles are sterically-stabilized with respect to aggregation by the use of a physically-adsorbed or chemically-grafted soluble polymer. Details of the mechanism of such steric stabilization are provided by Napper in "Polymeric Stabilization of Colloidal Dispersions", (Academic Press: New York, 1983).

Procedures for effecting the synthesis of self-stable organosols, generally involving nonaqueous dispersion polymerization, are known to those skilled in the art and are described in detail in "Dispersion Polymerization in Organic Media", K. E. J. Barrett ed., (John Wiley: New York, 1975).

In simplified terms, nonaqueous dispersion polymerization is a free radical polymerization carried out when one or more ethylenically-unsaturated (typically acrylic) monomers, soluble in a hydrocarbon medium, are polymerized in the presence of a preformed amphipathic polymer. The preformed amphipathic polymer, commonly referred to as the stabilizer, has two distinct functional blocks, one essentially insoluble in the hydrocarbon medium, the other freely soluble. When the polymerization proceeds to a fractional conversion of monomer corresponding to a critical molecular weight, the solubility limit is exceeded and the polymer precipitates from solution, forming a core particle. The amphipathic polymer then either adsorbs onto or covalently bonds to the core, which continues to grow as a discrete particle The particles continue to grow until monomer is depleted. The adsorbed amphipathic polymer "shell" acts to sterically-stabilize the growing core particles with respect to aggregation. The resulting core/shell polymer particles comprise a self-stable, nonaqueous colloidal dispersion (organosol) comprised of distinct spherical particles in the size (diameter) range 0.1–1 microns.

The composition of the insoluble organosol core is preferentially manipulated such that the organosol exhibits an effective glass transition temperature ($T_g$) of less than the development temperature (typically 23° C.), thus causing a toner composition containing the organosol as a major component to undergo rapid film formation (rapid self fixing) in printing or imaging processes that are carried out at temperatures greater than the core $T_g$. Rapid self fixing is a liquid toner performance requirement to avoid printing defects (such as smearing or loss of image resolution) in high speed printing. The use of low $T_g$ resins to promote rapid self fixing of printed or toned images is known in the art, as exemplified by "Film Formation" (Z. W. Wicks, Federation of Societies for Coatings Technologies, 1986, p.8).

The resulting organosols can be subsequently converted to a liquid toner by incorporation of the metal catalyst and charge director, followed by high shear homogenization, ball-milling, attritor milling, high energy bead (sand) milling or other means known in the art for effecting particle size reduction in a dispersion. The input of mechanical energy to the dispersion during milling acts to break down aggregated particles into primary particles (0.05–1.0 micron diameter) and to "shred" the organosol into fragments which adhere to the newly-created metal catalyst surface, thereby acting to sterically-stabilize the metal particles with respect to aggregation. The charge director may physically or chemically adsorbed onto the metal surface, the organosol or both. The result is a sterically-stabilized, charged, nonaqueous metal catalyst dispersion in the size range 0.1–2.0 microns, with typical toner particle diameters between 0.1–0.5 microns.

In summarizing the properties of organosol formulations, it is convenient to denote the composition of each particular organosol in terms of the ratio of the total weight of monomers comprising the organosol core relative to the total weight of graft stabilizer comprising the organosol shell. This ratio is referred to as the core/shell ratio of the organosol. In addition, it will be useful to summarize the compositional details of each particular organosol by ratioing the weight percentages of monomers used to create the shell and the core. For example, the preferred organosol can be designated LMA/HEMA-TMI//MMA/EA(97/3–4.7//25/75%w/w), and comprises a shell composed of a graft stabilizer precursor which is a copolymer consisting of 97 weight percent lauryl methacrylate (LMA) and 3 weight percent hydroxyethylmethacrylate (HEMA), to which is covalently bonded a grafting site consisting of 4.7 weight percent TMI (dimethyl-m-isopropanol benzylisocyanate, from CYTEC Industries) based upon the total weight of the graft stabilizer precursor. This graft stabilizer is subsequently covalently bonded to an organosol core which is comprised of 25 weight percent methyl methacrylate (MMA) and 75 weight percent ethyl acrylate (EA). The weight ratio of core to shell in the preferred organosol is adjusted to 4.

The preferred organosol makes use of an LMA/HEMA graft stabilizer precursor which is similar to the LMA/GMA (glycidyl methacrylate precursor described in example IV of U.S. Pat. No. 3,900,412; however, the grafting site was changed to permit grafting via formation of a polyurethane linkage between a hydroxyl group and an isocyanate, as opposed to grafting via formation of an epoxide linkage between glycidyl methacrylate and methacrylic acid. The grafting site was changed in order to take advantage of raw materials already available. In addition, the polymerization of the preferred organosol was carried out in ISOPAR L (the carrier liquid selected for use in fabricating toners) using azobisisobutyronitrile (AZDN from Elf-Atochem) as the free radical initiator. The AZDN initiator was selected to provide a higher effective initiator concentration and lower initiator half-life relative to benzoyl peroxide, thereby limiting the molecular weight of the graft stabilizer to values below 500,000 Daltons.

The actual process for making the toner is as follows. Aldrich Chemical Company sells a number of palladium powders, one of which (Product #32666-6) is certified 99.9 percent by weight sub-micron with a number mean diameter of 0.33 micron. A 5 gram sample of this material was acquired and prepared 120 g of the following electroless plating toner was formulated.

Preferred Organosol: 17 g

32666-6 Colloidal Pd: 2 g

Zirconium HEX-CEM (12%) 1 g

ISOPAR L: 100 g

This toner was milled for 1.5 hours @ 2000 RPM using 1–2 mm stainless steel shot. The mean particle size was 0.333 microns. It appears that milling was effective at reducing the palladium powder to primary particles.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for applying a metal catalyst to an amorphous semiconductor layer, said method comprising the steps of:
    a) image-wise exposing a photopolymeric layer to cause exposed areas of said layer to crosslink and exhibit an increase in resistivity in comparison with unexposed areas of said photopolymeric layer;
    b) charging said photopolymeric layer, said exposed areas of said photopolymeric layer retaining a charge longer than said unexposed areas;
    c) applying a catalyst metal containing toner to said photopolymeric layer, said toner attracted by retained charge on said exposed areas; and
    d) juxtaposing said photopolymeric layer toned in step c) to a layer of amorphous semiconductor and applying an electric field therebetween to cause said toner that is adherent to said photopolymeric layer to migrate to said amorphous semiconductor.

2. The method as recited in claim 1, wherein said toner comprises metal particles encompassed by polymeric shells.

3. The method as recited in claim 2, wherein said metal particles are selected from the group consisting of palladium, nickel and chromium.

4. The method as recited in claim 1, wherein step d) interposes a nonconductive fluid between said juxtaposed photopolymeric layer and said layer of amorphous semiconductor.

5. The method as recited in claim 1, wherein said semiconductor is silicon.

6. The method as recited in claim 1, further comprising the step of:
    e) annealing said toned amorphous silicon layer to enable formation of polycrystalline semiconductor areas only in areas where said toner is adherent.

7. The method as recited in claim 1, wherein said toner comprises an organosol with an included metal catalyst.

8. The method as recited in claim 1, wherein said photopolymer is configured on a flat support.

9. A method for applying a metal catalyst to an amorphous semiconductor layer, said method comprising the steps of:
    a) image-wise exposing a photopolymeric layer to cause exposed areas of said layer to crosslink and exhibit an increase in resistivity in comparison with unexposed areas of said photopolymeric layer;
    b) charging said photopolymeric layer, said exposed areas of said photopolymeric layer retaining a charge longer than said unexposed areas;
    c) applying a catalyst metal containing toner to said photopolymeric layer, said toner attracted by retained charge on said exposed areas;
    d) juxtaposing said photopolymeric layer toned in step c) to a substrate and applying an electric field therebetween to cause said toner that is adherent to said photopolymeric layer to migrate to said substrate; and
    e) depositing a layer of an amorphous semiconductor on said substrate and over said toner thereon.

10. The method as recited in claim 9, wherein said toner comprises metal particles encompassed by polymeric shells.

11. The method as recited in claim 10, wherein said metal particles are selected from the group consisting of palladium, nickel and chromium.

12. The method as recited in claim 9, wherein step d) interposes a nonconductive fluid between said juxtaposed photopolymeric layer and said substrate.

13. The method as recited in claim 9, wherein said semiconductor is silicon.

14. The method as recited in claim 9, further comprising the step of:
    e) annealing said amorphous silicon layer to enable formation of polycrystalline semiconductor areas only in areas where said toner is in contact with said amorphous semiconductor.

15. The method as recited in claim 9, wherein said toner comprises an organosol with an included metal catalyst.

16. The method as recited in claim 9, wherein said photopolymer is configured on a flat support.

* * * * *